(12) United States Patent
Kuhns et al.

(10) Patent No.: US 7,826,582 B2
(45) Date of Patent: Nov. 2, 2010

(54) NUMERICALLY CONTROLLED OSCILLATOR (NCO) OUTPUT CLOCK PHASE SMOOTHING

(75) Inventors: Mark D. Kuhns, Peoria, AZ (US); Daniel L. Simon, Glendale, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 810 days.

(21) Appl. No.: 11/523,123

(22) Filed: Sep. 18, 2006

(65) Prior Publication Data

US 2008/0069284 A1    Mar. 20, 2008

(51) Int. Cl.
*H03D 3/24* (2006.01)
*H04L 7/00* (2006.01)
*H03L 7/06* (2006.01)
*H03L 7/00* (2006.01)

(52) U.S. Cl. .................. 375/375; 375/376; 375/371; 375/373; 327/146; 327/147; 327/149; 327/150; 327/152; 327/153; 327/156; 327/157; 327/158; 327/159

(58) Field of Classification Search ......... 375/371–376; 327/12, 146, 147, 149, 150, 152, 153, 156–159
See application file for complete search history.

(56) References Cited

U.S. PATENT DOCUMENTS

| | | | |
|---|---|---|---|
| 5,365,182 A | 11/1994 | King | |
| 6,424,185 B1 | 7/2002 | Wolf | |
| 6,429,693 B1 * | 8/2002 | Staszewski et al. | 327/12 |
| 6,650,721 B1 | 11/2003 | Janesch et al. | |
| 6,983,032 B2 * | 1/2006 | Mujica et al. | 375/375 |
| 7,271,634 B1 * | 9/2007 | Daga et al. | 327/149 |
| 7,570,725 B1 * | 8/2009 | Ciccone et al. | 375/371 |
| 2004/0070432 A1 * | 4/2004 | Chauhan | 327/156 |
| 2006/0056563 A1 * | 3/2006 | Aweya et al. | 375/376 |
| 2006/0145740 A1 * | 7/2006 | Park et al. | 327/158 |
| 2006/0250170 A1 * | 11/2006 | Wang | 327/156 |
| 2007/0164800 A1 * | 7/2007 | Josephson | 327/158 |

\* cited by examiner

*Primary Examiner*—Mohammad H Ghayour
*Assistant Examiner*—Eboni Giles

(57) ABSTRACT

A system and method for performing output clock phase smoothing. A phase smoothing circuit is described and includes a numerically-controlled oscillator (NCO) configured to produce a plurality of NCO clock pulses at a selectable frequency that is based on an input clock. Edges of the plurality of NCO clock pulses are aligned to edges of the input clock. A phase error calculation module is coupled to the NCO and is configured to generate a corresponding phase error for each of the plurality of NCO clock pulses. A clock phase selectable delay is coupled to the phase error calculation module and is configured to adjust each of the plurality of NCO clock pulses according to the corresponding phase error to generate an output clock at the selectable frequency that are phase-adjusted to more closely match an ideal output clock phase. Edges of the output clock need not necessarily align to the edges of the input clock.

11 Claims, 4 Drawing Sheets

NUMERICALLY CONTROLLED OSCILLATOR (NCO) OUTPUT CLOCK PHASE SMOOTHING

BACKGROUND OF THE INVENTION

1. Field of the Invention

Embodiments of the present invention relate to the field of numerically-controlled oscillators. More particularly, embodiments of the present invention relate generally to minimizing jitter in a clock generated by a numerically-controlled oscillator.

2. Related Art

Numerically-controlled oscillators (NCOs) are digital circuits that are commonly used for clock frequency synthesis and control based on an accumulator and control register. An NCO's output clock average frequency can be made to be arbitrarily accurate over some duration that includes many output clock cycles. Frequency precision is determined by the input clock frequency and NCO accumulator width. In particular, NCOs are often used in digital PLL implementations and are analogous in function to voltage-controlled oscillators (VCOs) in analog PLLs. NCOs have a advantage over analog VCOs in that the frequency output can be controlled exactly and there are not the inherent issues of noise, drift, etc, that are present with VCOs.

However NCOs, being digital in nature, do suffer from jitter induced by the time discretization of clock phase. That is, any leading edge of a clock pulse of an NCO clock signal is constrained to align with the occurrence of an input clock edge. Therefore, the time from one NCO clock edge to the next can vary by one input clock period. While the average frequency of the NCO clock can be made as precise as desired, there is always jitter on the clock that is equal to the period of the input clock.

SUMMARY OF THE INVENTION

Specifically, in one embodiment, a phase smoothing system is described that includes a numerically-controlled oscillator (NCO) configured to produce a plurality of NCO clock pulses at a selectable frequency that is based on an input clock. Edges of the plurality of NCO clock pulses are aligned to edges of the input clock. A phase error calculation module is coupled to the NCO and is configured to generate a corresponding phase error for each of the plurality of NCO clock pulses. A clock phase selectable delay is coupled to the phase error calculation module and is configured to adjust the phase of each of the plurality of NCO clock pulses according to the corresponding phase error to generate an output clock at the selectable frequency. Edges of the output clock are adjusted according to the phase error to better approximate the ideal phase and need not necessarily align to the edges of the input clock.

DETAILED DESCRIPTION OF THE INVENTION

Figure 1:
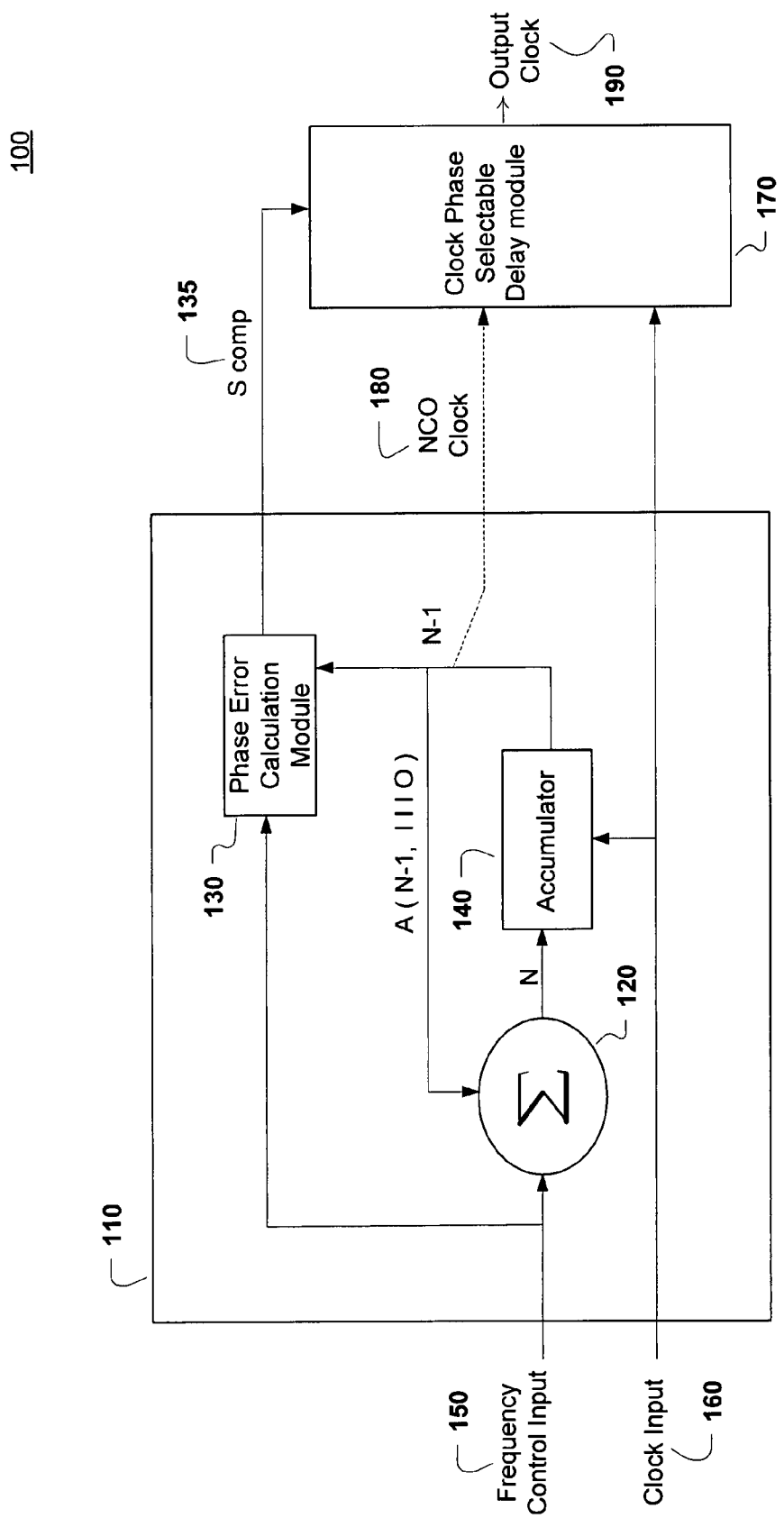
FIG. 1 is a block diagram of a system capable of minimizing jitter in an output clock of an NCO, in accordance with one embodiment of the presently claimed invention.

Reference will now be made in detail to the preferred embodiments of the present invention, a system and method for minimizing jitter in a clock generated by an NCO, examples of which are illustrated in the accompanying drawings.

Accordingly, various embodiments of the present invention disclose a system and method for performing NCO output clock phase smoothing. Embodiments of the present invention provide the above accomplishments and further provide for minimizing jitter in a output clock signal generated by an NCO.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Notation and Nomenclature

Embodiments of the present invention can be implemented on hardware or software running on a computer system in conjunction with an imaging system, such as an LCD display (e.g., television display). The computer system can be a personal computer, notebook computer, server computer, mainframe, networked computer, workstation, and the like. This software program is operable for providing NCO clock phase smoothing. In one embodiment, the computer system includes a processor coupled to a bus and memory storage coupled to the bus. The memory storage can be volatile or non-volatile and can include removable storage media. The computer can also include a display, provision for data input and output, etc.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of operations or instructions leading to a desired result. The operations are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "determining," "generating," "applying," or the like, refer to the actions and processes of a computer system, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

NCO Clock Phase Smoothing

Embodiments of the present invention implement an NCO clock for the purpose of deriving a secondary clock from a primary clock that exhibits minimal jitter. In particular, embodiments of the present invention are capable of reducing the jitter on the output of the NCO clock when compared to the jitter produced by the discretization produced by conventional NCO clock outputs.

FIG. 1 is a block diagram of a phase smoothing system 100 that is capable of minimizing the jitter of a clock produced by an NCO, in accordance with one embodiment of the present invention. The NCO clock jitter is reduced by the addition of a clock phase selectable delay module following the NCO 110. The NCO clock jitter is reduced from one clock period of the input clock in conventional NCO systems by a selectable factor, L, described more fully below.

The phase smoothing system 100 comprises an NCO 110 that is configured to produce an NCO clock 180 comprising a plurality of NCO clock pulses at a selectable frequency. The NCO clock is based on an input clock 160 and a reference input, the frequency control input 150. While the NCO clock 180 generates a very precise average clock frequency, the NCO clock 180 exhibits clock cycle-to-cycle jitter at this point. That is, edges (e.g., leading edges) of the plurality of NCO clock pulses of the NCO clock 180 are aligned to the edge of the input clock 160. As such, the resulting jitter is equal to the period of the input clock 160, Tckin, for example.

In one embodiment, the NCO 110 comprises an accumulator 140 that is configured to receive the input clock 160 and provide a previous accumulated value (e.g., N-1) at a leading edge of the input clock. The output of the accumulator is sent to the summation block and the phase error calculation module 130. For purposes of illustration, embodiments of the present invention are described as being triggered upon leading edges of the input clock 160. However, other embodiments are well suited to being triggered upon falling edges of the input clock 160.

The summation block 120 is coupled to the accumulator 140 and is configured to sum the previous accumulated value (e.g., N-1) with the frequency control input 150 at the edge of the input clock. The summation block 120 generates a next previous accumulated value (e.g., N) for storing in the accumulator 140.

As a result, the accumulator 140 continually sums a stored value with the frequency control input 150 at each leading edge of the input clock. As a result, the accumulator 140 is capable of producing the plurality of NCO clock pulses of the NCO clock 180. In particular, in one embodiment the accumulator 140 generates an NCO clock pulse (e.g., N-1) based upon the accumulated value in the accumulator. In one embodiment, accumulator 140 generates the NCO clock pulse based on a bit of the accumulated value. In another embodiment, accumulator 140 generates the NCO clock pulse based on a most significant bit (MSB) of the accumulated value outputted by the accumulator 140. In still another embodiment, accumulator 140 generates the NCO clock pulse when the MSB is 1.

In particular, the average output frequency of the NCO 110 is given in Equation 1, as follows:

$$\bar{f}_{NCO} = f_{CLKIN} \frac{\Delta}{2^N} \quad (1)$$

In equation 1, the term, $\bar{f}_{NCO} \in \Re$, refers to the NCO output 180 average frequency in Hz. Also, the term, $f_{CLKIN} \in \Re$, refers to the input clock 160 frequency in Hz. The term, $M_{NCO} \in \mathfrak{I}$, refers to the accumulator 140 magnitude, which in one embodiment is a power of 2 (e.g., $M_{NCO}=2^N$) Also, the term, $N \in \mathfrak{I}$, refers to the number of bits in the accumulator 140. The term, $\Delta \in \mathfrak{I}$, refers to the NCO frequency control input 150.

The NCO 110 also comprises a phase error calculation module 130. In one embodiment, the phase error calculation module is coupled to the accumulator 140 and is configured to receive the outputs (e.g., N-1) of the accumulator 140. For each pulse of the NCO clock 180, the phase error calculation module is configured to generate a corresponding phase error.

In particular, the phase error calculation module 130 generates a select input, $S_{COMP}$ 135, that represents the corresponding phase error of the NCO clock pulse (e.g., N-1). This select input is used to generate a phase delay applied to the NCO clock pulse in order to reduce the jitter of the NCO clock 180.

In one embodiment, the phase error calculation module 130 is configured to determine a phase error of the NCO clock pulse (e.g., N-1) generated by the accumulator 140. The phase error is determined by comparing the actual phase of the NCO clock pulse to a phase of an ideal NCO clock at the selectable frequency, as will be described more fully below. Additionally, the phase error is based on fractional bits of the accumulated value in the accumulator 140, in one embodiment, or a combination of the accumulated value in the accumulator 140 and the frequency control input 150, in accordance with another embodiment.

In one embodiment, a delay pipeline is introduced after the phase error calculation module. The delay pipeline comprises at least one phase of the clock input and is applied to the output clock 190 uniformly. The delay pipeline is introduced to allow for the phase error calculation module 130 to execute its calculations, in one embodiment.

The phase smoothing system 100 also comprises a clock phase selectable delay 170 that is coupled to the phase error calculation module 130. The clock phase selectable delay 170 is configured to adjust each of the plurality of NCO clock pulses of the NCO clock 180 according to its corresponding phase error (e.g., the select inputs generated by the phase error calculation module 130) to generate an output clock with reduced jitter at the selectable frequency. In particular, the leading edges of the output clock need not necessarily align to the leading edges of the input clock. More specifically, edges of the output clock are phase-adjusted to more closely approximate the ideal output phase and need not necessarily align to the edges of the input clock.

In particular, the phase error of an NCO clock pulse generated by the NCO 110 is determined below. At any given time, the value of the accumulator 140 may be considered to represent the phase of the NCO clock pulse (e.g., N-1) in a digital format, as represented by Equation 2, below:

$$\phi_{NCO}(t) = \frac{A(t)}{2^N} \quad (2)$$

In equation 2, A(t) is the instantaneous value of the accumulator 140. Since the NCO clock 180 is the MSB of the accumulator 140, in one embodiment, this can be considered a gross approximation of the true phase, which is accurate to 180 degrees of resolution.

From equation 1, the incremental normalized phase change of the accumulator is given by Equation 3, below:

$$\partial \phi_{NCO} = \frac{\bar{f}_{NCO}}{f_{CLK}} = \frac{\Delta}{2^N} \quad (3)$$

This is also the upper bound of the phase error when an NCO clock edge occurs. At every edge of the NCO clock 180, the normalized phase error of the corresponding NCO clock pulse is given by Equation 4, below:

$$0 \leq \phi_{ERRNCO} < \partial \phi_{NCO} \quad (4)$$

Additionally, the actual phase of the corresponding NCO clock pulse can also be determined from the fractional bits of the accumulator 140, in one embodiment. The fractional bits ($A_{FRAC}$) is all the values less the MSB in the accumulator 140. The actual phase is given by Equation 5, below:

$$\phi_{ERRNCO} = \frac{A_{FRAC}}{2^N} \quad (5)$$

The actual phase is used to remove the phase error caused by the discretization of the edge of the NCO clock 180, in one embodiment. In particular, Equation 5 represents the normalized phase error, which is the difference between the ideal clock edge (e.g., 0 degrees) and the actual phase of the NCO clock pulse of the NCO clock 180 generated by the NCO 110. This is normalized to the NCO clock frequency. However, since this phase error is bounded per Equation 4, compensation for the phase error is only necessary within this boundary. As such, the phase error is expressed as a normalized error with respect to the input clock period in Equation 6, below:

$$\phi_{ERRCLK} = \frac{\phi_{ERRNCO}}{\partial \phi_{NCO}} = \frac{A_{FRAC}}{\Delta} (0 \leq \phi_{ERRCLK} < 1) \quad (6)$$

Figure 3:
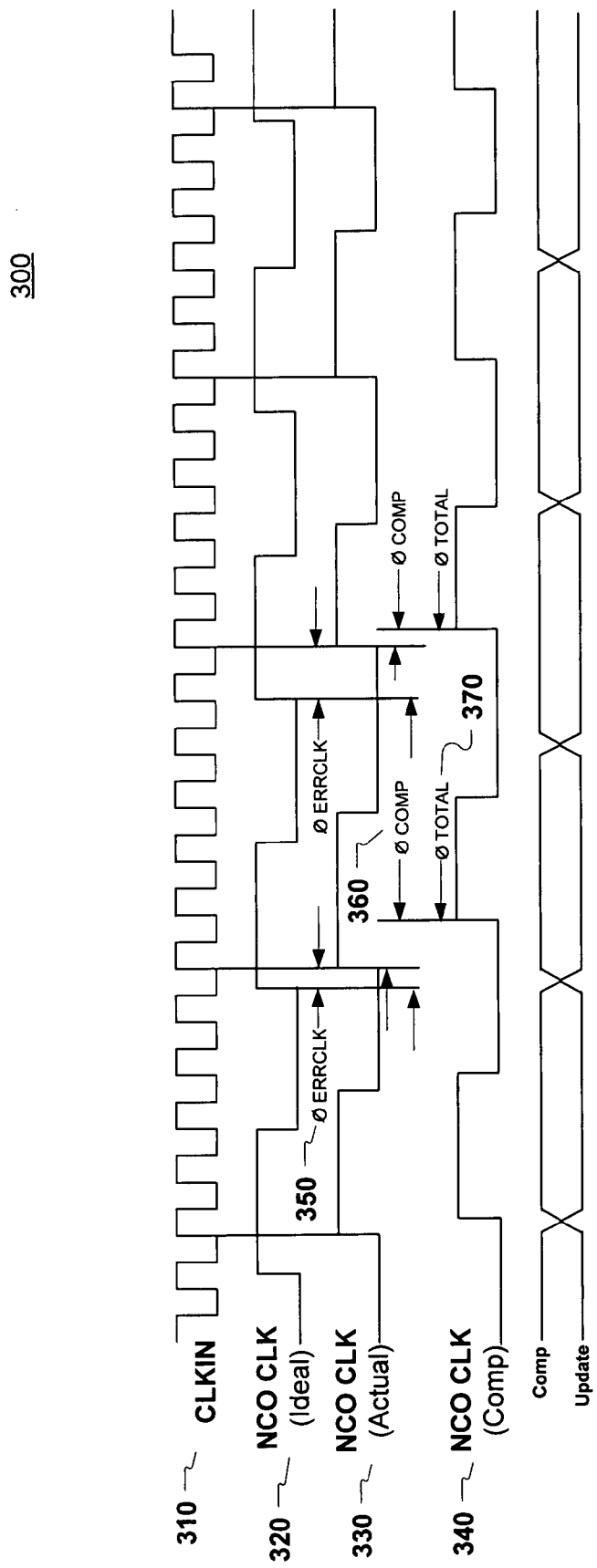
FIG. 3 is a timing diagram illustrating phase delay compensation of an output clock of an NCO of FIG. 1, in accordance with one embodiment of the present invention.

FIG. 3 is a timing diagram 300 illustrating the timing of signals generated by the system 100, in accordance with one embodiment of the present invention. For instance, FIG. 3 illustrates the timing of the clock input signal (CLKIN) 310. Also, the actual NCO clock (NCO CLK) 320 is shown. In one embodiment, actual NCO CLK is analogous to the NCO clock 180 of FIG. 1. In addition, FIG. 3 also illustrates the compensated NCO clock (NCO CLK) 340 that compensates for the phase error produced by the NCO 110.

In particular, the phase error calculated in Equation 6 illustrates the difference in phase between the ideal NCO CLK 320 and the actual clock pulse of the NCO CLK 330. For example, the difference is shown by the $\phi_{ERRCLK}$ 350.

The normalized error (e.g., $\phi_{ERRCLK}$ 350) calculated in Equation 6 represents a "lag" in the actual phase of the actual NCO CLOCK 330. This lag occurs since an error of zero implies that the NCO clock edge of the actual NCO CLK 330 occurs exactly where it should have ideally in the ideal NCO CLK 320. As such, a positive error indicates that the actual NCO clock edge from the actual NCO CLK 330 occurs later than ideally by an amount that is equal to the phase error calculated in Equation 6. In one embodiment, to compensate for this phase error calculated in Equation 6, it is necessary to add phase delay that is one minus the phase error, as calculated below in Equation 7:

$$\phi_{COMP} = 1 - \phi_{ERRCLK} \quad (7)$$

The compensated phase error calculated in Equation 7 is shown as $\phi_{COMP}$ 360 in FIG. 3.

In addition, as shown in FIG. 3, the phase delay of the NCO phase compensation can be made constant, as shown below in Equation 8:

$$\phi_{TOTAL} = \phi_{ERRCLK} + \phi_{COMP} = 1 (= T_{CLKIN}) \quad (8)$$

The total phase, $\phi_{COMP}$ 370, is also shown in FIG. 3 as being constant. As shown in Equation 8, regardless of the phase error introduced by the discretization of the NCO 110, this phase error is removed by the compensation scheme to produce a fixed phase delay, with minimal, or no jitter.

Figure 2:
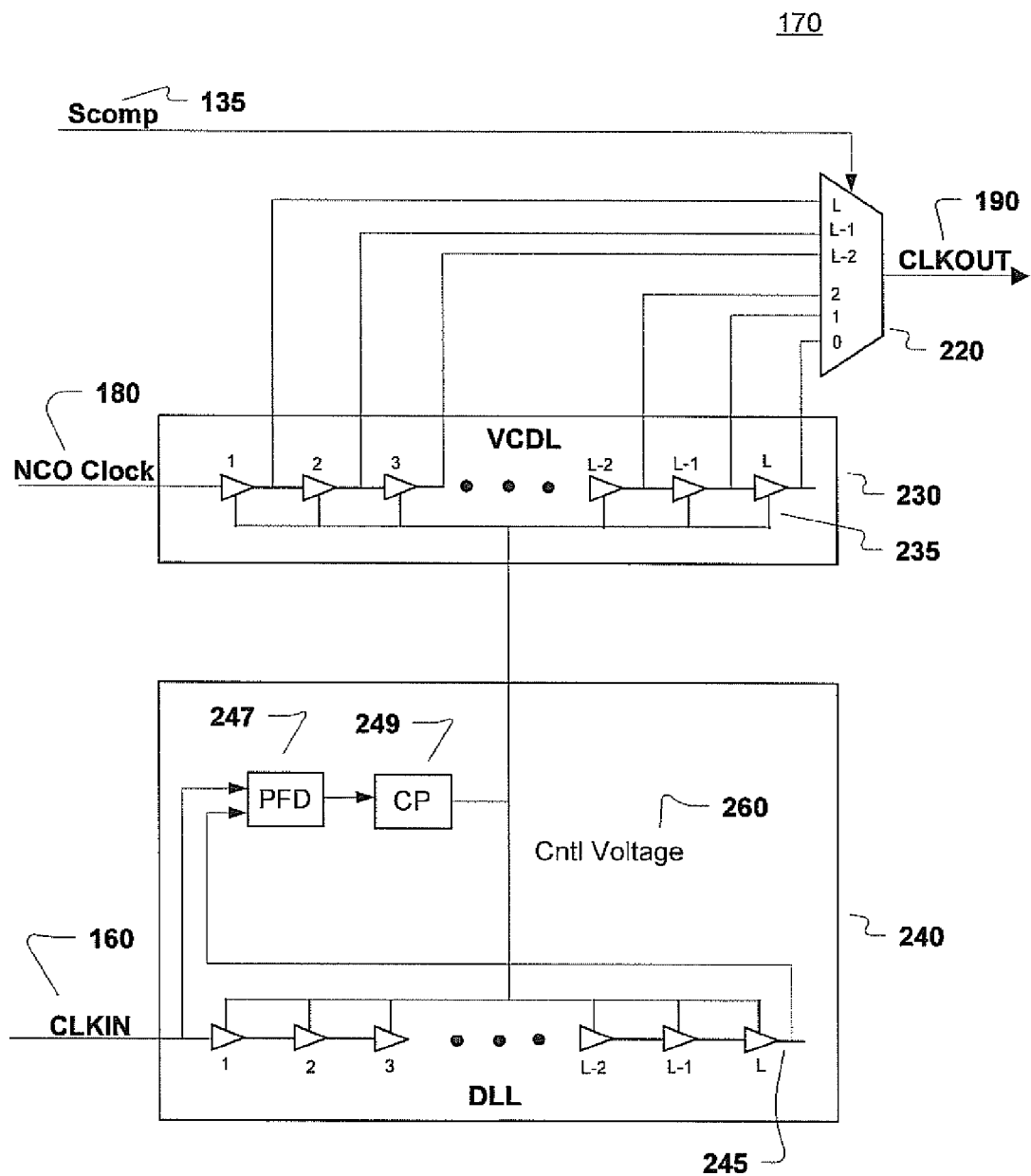
FIG. 2 is a block diagram of the clock phase selectable delay module of FIG. 1, in accordance with one embodiment of the present invention.

Turning now to FIG. 2, a block diagram of the clock phase selectable delay (CPSD) module 170 is illustrated in more detail, in accordance with one embodiment of the present invention. The CPSD module 170 produces phased-delayed versions of the NCO clock pulse (e.g., N–1) of the NCO clock 180 based on select inputs, $S_{comp}$ 135, outputted by the phase error calculation module.

The CPSD module 170 produces the phase compensation in Equation 7. The CPSD module 170 comprises a delay-locked loop (DLL) 240 that is configured to receive the input clock 160. In particular, the DLL 240 locks the input clock 160 to L equal phases, in one embodiment. That is, the DLL locks the input clock 160 such that L equal phases of the period, $T_{ckin}$, of the input clock 160 is represented by the delay stages in the buffer string 245 as shown by buffer L.

In particular, the input clock 160 is continually locked by the phase frequency detector (PFD) 247 and the charge pump 249. That is, the PFD 247 is coupled to the string of buffers 245 and is configured to calculate a difference error when the L equal phases do not equal the input clock period, $T_{ckin}$. Further, the charge pump 249 is coupled to the PFD 247 and is configured to correct for the difference in order to lock the string of buffers 245 to the input clock, which yields L equally spaced phases over the input clock period, $T_{ckin}$.

In addition, the CPSD module 170 comprises a voltage controlled delay line (VCDL) 230 that is coupled to the accumulator 140. The VCDL 230 is configured to receive the plurality of NCO clock pulses of the NCO clock 180. In addition, the VCDL 230 is configured to generate L equal phases of the input clock period, $T_{ckin}$. That is, the DLL 240 generates a controlled voltage 260 which controls the voltage across the delay stages of the buffer string 235 represented by buffer L in the VCDL 230.

The VCDL 235 has identical and matching delay stages in buffer string 235 as the buffer string 245 in the DLL 240. As such, the VCDL 230 forms a delay line whose delay is exactly equal to one input clock period, $T_{ckin}$, and whose phases are each represented by $T_{ckin}/L$.

The CPSD module 170 also comprises a multiplexer 190 that is coupled to the phase error calculation module 130. The multiplexer is configured to receive the corresponding phase error of an input NCO clock pulse (e.g., N–1) and to select an appropriate phase delay based on the corresponding phase error. The appropriate phase delay is applied to the corresponding NCO clock pulse (e.g., N–1) of said plurality of NCO clock pulses to generate the output clock 190.

In particular, the NCO clock pulse (e.g., N–1) is passed through the VCDL 230 with the appropriate phase delay selected from the select signal $S_{comp}$ 135, as previously described. That is, the multiplexor selects the appropriate tap point in the buffer string 235 to add the appropriate phase delay to the NCO clock pulse (e.g., N–1) to reduce jitter, in one embodiment.

In one embodiment, since there is a discrete number of phase selections available, the phase compensation of Equation 7 is modified in Equation 9 to generate $S_{COMP}$ 135.

$$S_{COMP} = \phi_{ERRCLK} L = \frac{A_{FRAC}}{\Delta} L \qquad (9)$$

In Equation 9, $S_{COMP}$ is truncated to the nearest integer value, in one embodiment. As seen in FIG. 2, a lower value of $S_{COMP}$ selects a larger phase delay to implement the inverse relationship of Equation 7. In embodiments of the present invention, L can be varied to increase the number of phase taps in the delay line of the buffer string 235 in order to meet jitter requirements of the overall system.

In another embodiment, the output clock 190 is designed to be glitchless. In particular, the select input $S_{COMP}$ is changed only when all of the elements of the VCDL buffer string 235 are at the same value (e.g., all low). When the multiplexer 220 is glitchless under these conditions, jitter in the output clock 190 is minimized, and glitchless, in on embodiment.

Figure 4:
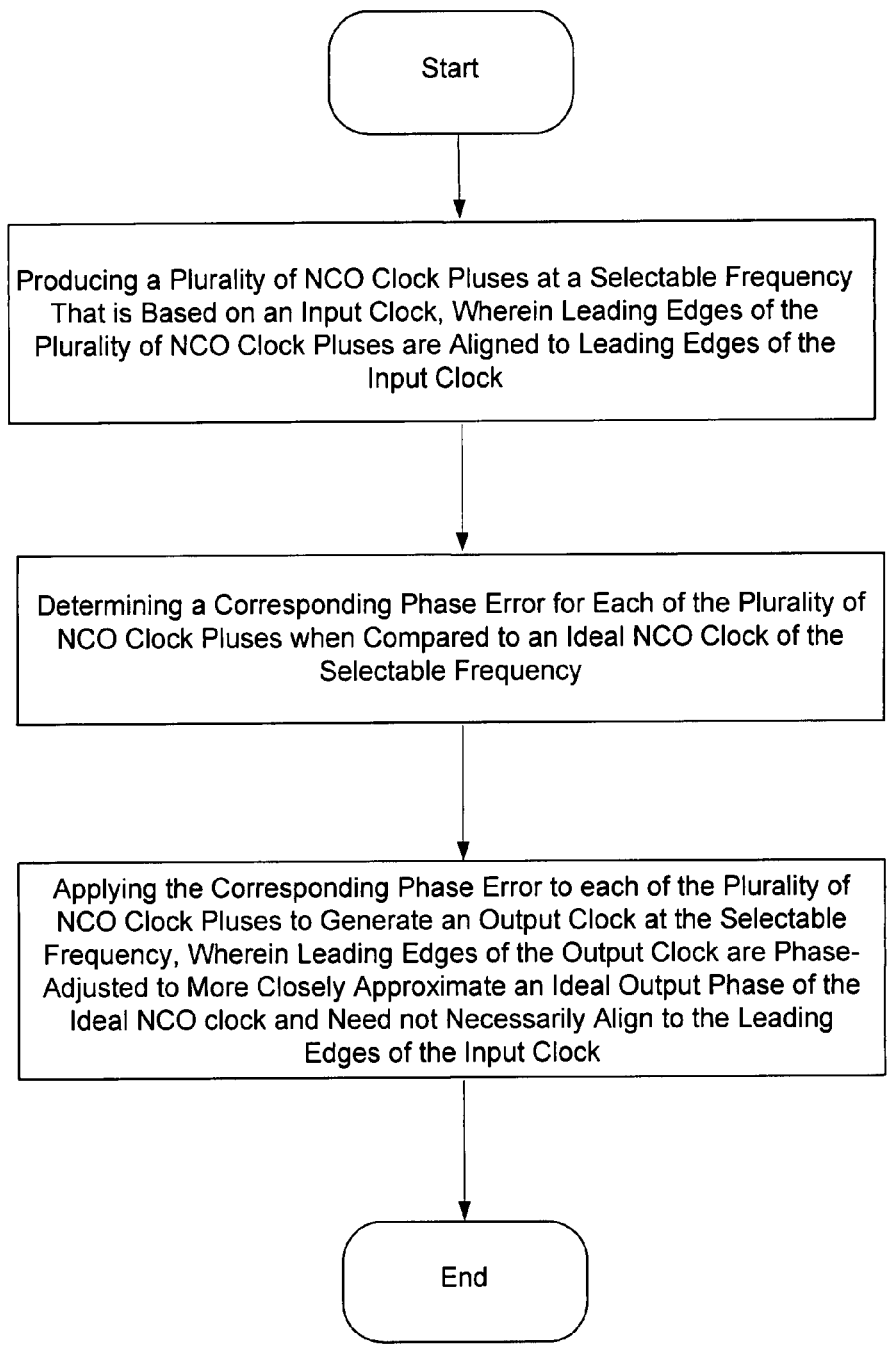
FIG. 4 is a flow diagram 400 illustrating a method for minimizing jitter in an output clock of an NCO, in accordance with one embodiment of the present invention.

FIG. 4 is a flow diagram 400 illustrating steps in a method for providing phase smoothing to an NCO clock, in accordance with one embodiment of the present invention. That is, the present embodiment minimizes jitter in an output clock generated by an NCO.

At 410, the present embodiment produces a plurality of NCO clock pulses at a selectable frequency that is based on an input clock. In particular, the NCO 110 produces the plurality of NCO clock pulses at the selectable frequency. Leading edges of the plurality of NCO clock pulses are aligned to leading edges of the input clock.

More particularly, at a leading edge of the input clock, the present embodiment sums a previous accumulated value with a frequency control input to generate a current accumulated value. The current accumulated value comprises the next previous accumulated value for the next cycle introduced by the next leading edge of the input clock.

Also, the present embodiment generates an NCO clock pulse of the plurality of NCO clock pulses when a MSB of the previous accumulated value is 1. That is, whenever the MSB of the accumulated value in the accumulator 140 of FIG. 1 asserts a value of 1, the accumulator generates an NCO clock pulse (e.g., N–1).

At 420, the present embodiment determines a corresponding phase error for each of the plurality of NCO clock pulses. In particular, the phase error calculation module 130 determines the phase error. The phase error is calculated by comparing the actual phase of a corresponding NCO clock pulse to an ideal phase of an ideal NCO clock of the selectable frequency.

In particular, the present embodiment determines a normalized phase error of the NCO clock pulse based on fractional bits of the previous accumulated value and the frequency control input. The normalized phase error is compensated by subtracting the normalized phase error from 1 to generate the corresponding phase error of the corresponding NCO clock pulse.

At 430, the present embodiment applies the corresponding phase error to each of the plurality of NCO clock pulses. In particular, the CPSD module 170 applies the corresponding phase error to generate an output clock at the selectable frequency, which minimizes jitter. In particular, leading edges of the output clock need not necessarily align to leading edges of the input clock.

In particular, the present embodiment forms a delay line comprising L tap points that correspond to L equal phases of the input clock, for example in a VCDL. That is, the input clock is locked to L equal phases, for example in a DLL that controls the VCDL. After receiving the NCO clock pulse, the present embodiment is capable of selecting an appropriate tap point in the delay line based on the corresponding phase error to apply an appropriate phase delay to the corresponding NCO clock pulse. Thereafter, the present embodiment is capable of outputting the corresponding NCO clock pulse with the appropriate phase delay as part of the output clock.

In summary, the method of flow diagram 400 uses a CPSD module 170, which is made up of a DLL 240 which controls a VCDL 230. The CPSD module 170 produces L equally spaced delays of the input clock period, $T_{ckin}$, which is selected by a select input to the CPSD module 170. The appropriate delay is selected based on the NCO fractional bits on every NCO clock output. The output of the CPSD function is the output clock delayed by $i*T_{ckin}$, wherein i=0, 1, . . . , L–1. As such, this has the desired effect of reducing the NCO clock jitter from $T_{ckin}$ to $T_{ckin}/L$, in one embodiment.

Accordingly, various embodiments of the present invention disclose a system and method for performing NCO output clock phase smoothing. Embodiments of the present invention provide the above accomplishments and further provide for minimizing jitter in a output clock signal generated by an NCO.

Embodiments of the present invention, a system and method for minimizing jitter in a clock generated by an NCO are described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

What is claimed is:

1. A phase smoothing system, comprising:
    a numerically-controlled oscillator (NCO) configured to produce a plurality of NCO clock pulses at a selectable frequency that is based on an input clock, wherein said NCO is configured to receive said input clock and provide an accumulated value at an edge of said input clock and to continually sum said accumulated value with a frequency control input;
    a phase error calculation module coupled to said NCO configured to generate a phase error for each of said NCO clock pulses, wherein said phase error calculation module is configured to determine a phase error of each of said NCO clock pulses based on fractional bits of said accumulated value normalized by said frequency control input; and
    a clock phase selectable delay module coupled to said phase error calculation module and comprising:

a delay-locked loop (DLL) configured to receive said input clock and lock said input clock to a number L of equal phases;

a voltage controlled delay line (VCDL) configured to receive said NCO clock pulses and comprising a delay line comprising said number L of delay elements and said number L of tap points corresponding to said L equal phases, wherein each of said NCO clock pulses is adjusted by: i) selecting one of said tap points based on said phase error and an input to determine a respective phase delay, wherein said input comprises fractional bits of said accumulated value normalized by a frequency control input and scaled by said number L and wherein said input is changed only when each of said delay elements is at a same value, and ii) applying said respective phase delay to said NCO clock pulse, to generate an output clock at said selectable frequency;

a multiplexer coupled to said phase error calculation module and configured to receive said input that is used to select said tap point based on said phase error.

2. The phase smoothing system of claim 1, wherein said NCO comprises an accumulator configured to receive said input clock and provide said accumulated value at said edge of said input clock.

3. The phase smoothing system of claim 2, wherein said NCO further comprises a summation block coupled to said accumulator configured to continually sum values in said accumulator with said frequency control input.

4. The phase smoothing system of claim 3, wherein said summation block is configured to sum said frequency control input with said accumulated value at said edge of said input clock and generate a next previous accumulated value for storing in said accumulator.

5. The phase smoothing system of claim 2, wherein said accumulator is configured to output said plurality of NCO clock pulses.

6. The phase smoothing system of claim 2, wherein said phase error calculation module is configured to determine said phase error of an NCO clock pulse generated by said accumulator that is compared to an ideal NCO clock at said selectable frequency.

7. The phase smoothing system of claim 1, wherein said DLL comprises:
a string of L number of buffers;
a phase frequency detector (PFD) coupled to said string configured to calculate a difference error when said L equal phases do not equal an input clock period; and
a charge pump coupled to said PFD to correct for said difference error to lock said string to said input clock.

8. A method for providing phase smoothing, comprising:
producing a plurality of NCO clock pulses at a selectable frequency that is based on an input clock, wherein leading edges of said plurality of NCO clock pulses are aligned to leading edges of said input clock;

at a leading edge of said input clock, summing an accumulated value with a frequency control input to generate a summed value;

determining a corresponding phase error for each of said plurality of NCO clock pulses when compared to an ideal NCO clock of said selectable frequency, said phase error based on fractional bits of said accumulated value normalized by said frequency control input;

locking said input clock to a number L of equal phases;

receiving said NCO clock pulses into a delay line comprising said number L of delay elements and said number L of tap points corresponding to said L equal phases, and adjusting each of said NCO clock pulses by:

selecting one of said tap points based on said phase error and an input to determine a respective phase delay, wherein said input comprises said fractional bits of said accumulated value normalized by said frequency control input and scaled by said number L and wherein said input is changed only when each of said delay elements is at a same value, and applying said respective phase delay to said NCO clock pulse, to generate an output clock at said selectable frequency.

9. The method of claim 8, further comprising generating an NCO clock pulse of said plurality of NCO clock pulses.

10. The method of claim 8, wherein said determining a corresponding phase error comprises:
determining a normalized phase error of an NCO clock pulse based on said fractional bits of said accumulated value; and
compensating for said normalized phase error to generate said corresponding phase error by subtracting said normalized phase error from 1.

11. The method of claim 8, further comprising outputting said NCO clock pulse with said appropriate phase delay as said output clock.

* * * * *

UNITED STATES PATENT AND TRADEMARK OFFICE
Certificate

Patent No. 7,826,582 B2                                                        Patented: November 2, 2010

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Mark D. Kuhns, Peoria, AZ (US); Daniel L. Simon, Glendale, AZ (US); and Chao-Ping Huang, Sunnyvale, CA (US).

Signed and Sealed this Twentieth Day of September 2011.

<div style="text-align:right;">
CHIEH M. FAN<br>
<em>Supervisory Patent Examiner</em><br>
Art Unit 2611<br>
Technology Center 2600
</div>